United States Patent
Zhang et al.

(10) Patent No.: US 12,408,270 B2
(45) Date of Patent: Sep. 2, 2025

(54) CIRCUIT BOARD AND METHOD FOR MANUFACTURING THE SAME, FUNCTIONAL BACKPLATE, BACKLIGHT MODULE AND DISPLAY APPARATUS

(71) Applicant: BOE Technology Group Co., Ltd., Beijing (CN)

(72) Inventors: Jiaxiang Zhang, Beijing (CN); Nianqi Yao, Beijing (CN); Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/017,902

(22) PCT Filed: Feb. 24, 2022

(86) PCT No.: PCT/CN2022/077542
§ 371 (c)(1),
(2) Date: Jan. 25, 2023

(87) PCT Pub. No.: WO2023/159405
PCT Pub. Date: Aug. 31, 2023

(65) Prior Publication Data
US 2024/0260185 A1    Aug. 1, 2024

(51) Int. Cl.
*H05K 1/11* (2006.01)
*H01L 21/48* (2006.01)
(Continued)

(52) U.S. Cl.
CPC .......... *H05K 1/111* (2013.01); *H01L 21/4846* (2013.01); *H01L 23/49838* (2013.01);
(Continued)

(58) Field of Classification Search
CPC .......... H05K 1/111; H05K 1/09; H05K 1/181; H05K 3/067; H10D 86/441; H10D 86/60;
(Continued)

(56) References Cited

U.S. PATENT DOCUMENTS

| 8,354,009 B2 | 1/2013 | Han et al. |
| 2002/0076911 A1 | 6/2002 | Lin |

(Continued)

FOREIGN PATENT DOCUMENTS

| CN | 101452988 A | 6/2009 |
| CN | 102024769 A | 4/2011 |

(Continued)

OTHER PUBLICATIONS

Machine English Translation of CN 110890323A (Year: 2020).*
(Continued)

*Primary Examiner* — Anne M Hines
(74) *Attorney, Agent, or Firm* — WHDA, LLP

(57) ABSTRACT

A circuit board and a method for manufacturing the circuit board, a functional backplate, a backlight module, a display apparatus, and a display panel are provided. The circuit board includes: a base substrate; a wire arranged on the base substrate, where the wire includes a first conductive layer; and at least one insulating layer arranged on a side of the first conductive layer away from the base substrate, where the at least one insulating layer covers the first conductive layer. The first conductive layer includes a first stacked structure on a side away from the base substrate and a second stacked structure proximate to the base substrate, and the first stacked structure includes at least an etch stop layer covering the second stacked structure.

19 Claims, 10 Drawing Sheets

(51) Int. Cl.
  H01L 23/498 (2006.01)
  H05K 3/06 (2006.01)
  H10D 86/40 (2025.01)
  H10D 86/60 (2025.01)
  *H01L 25/075* (2006.01)
  *H01L 25/16* (2023.01)
  *H05K 1/09* (2006.01)
  *H05K 1/18* (2006.01)

(52) U.S. Cl.
  CPC ........... H05K 3/067 (2013.01); H10D 86/441 (2025.01); H10D 86/60 (2025.01); *H01L 23/49866* (2013.01); *H01L 25/0753* (2013.01); *H01L 25/167* (2013.01); *H05K 1/09* (2013.01); *H05K 1/181* (2013.01); *H05K 2201/10106* (2013.01); *H05K 2201/10151* (2013.01)

(58) Field of Classification Search
  CPC ........... H01L 21/4846; H01L 23/49838; H01L 23/49866; H01L 25/0753; H01L 25/167
  See application file for complete search history.

(56) References Cited

U.S. PATENT DOCUMENTS

| | | |
|---|---|---|
| 2003/0127701 A1 | 7/2003 | Tiziani et al. |
| 2004/0166702 A1 | 8/2004 | Higashi |
| 2006/0222821 A1 | 10/2006 | Masai |
| 2007/0120233 A1 | 5/2007 | Tellkamp |
| 2008/0096015 A1 | 4/2008 | Yan |
| 2009/0297879 A1 | 12/2009 | Zeng et al. |
| 2011/0006415 A1 | 1/2011 | Bachman et al. |
| 2011/0062580 A1 | 3/2011 | Liu et al. |
| 2013/0000978 A1 | 1/2013 | Choi et al. |
| 2013/0107155 A1 | 5/2013 | Guo et al. |
| 2015/0099316 A1 | 4/2015 | Ryu et al. |
| 2017/0250171 A1 | 8/2017 | Yu et al. |
| 2017/0263645 A1 | 9/2017 | Liu et al. |
| 2019/0229446 A1 | 7/2019 | Kim et al. |
| 2021/0043817 A1 | 2/2021 | Liang et al. |
| 2021/0125566 A1 | 4/2021 | Yang et al. |
| 2021/0143134 A1 | 5/2021 | Wang |
| 2021/0242146 A1 | 8/2021 | Arvin et al. |
| 2021/0358896 A1 | 11/2021 | Lee et al. |
| 2021/0359182 A1 | 11/2021 | Cao et al. |
| 2022/0181245 A1 | 6/2022 | Ko et al. |
| 2024/0234658 A1 | 7/2024 | He et al. |
| 2024/0260185 A1 | 8/2024 | Zhang et al. |

FOREIGN PATENT DOCUMENTS

| | | |
|---|---|---|
| CN | 105578709 A | 5/2016 |
| CN | 105789218 A | 7/2016 |
| CN | 110890323 A | 3/2020 |
| CN | 111312742 A | 6/2020 |
| CN | 111862886 A | 10/2020 |
| CN | 113066834 A | 7/2021 |
| CN | 113096549 A | 7/2021 |
| CN | 113629079 A | 11/2021 |
| CN | 114509884 A | 5/2022 |
| CN | 114823608 A | 7/2022 |
| CN | 114843390 A | 8/2022 |
| EP | 2276063 A2 | 1/2011 |
| JP | 2009-253275 A | 10/2009 |
| KR | 10-2013-0068112 A | 6/2013 |
| KR | 10-2021-0133777 A | 11/2021 |
| TW | 200816488 A | 1/2008 |
| TW | 201417649 A | 5/2014 |
| WO | 2009/145462 A1 | 12/2009 |
| WO | 2020/153770 A1 | 7/2020 |

OTHER PUBLICATIONS

Extended Supplementary European Search Report dated Sep. 11, 2024, issued in counterpart Application No. 21969681.2. (11 pages).

Office Action dated Aug. 2, 2023, issued in counterpart TW application No. 111141791, with English translation. (32 pages).

Office Action dated Dec. 19, 2023, issued in counterpart TW application No. 112113817, with English translation. (22 pages).

Office Action dated Nov. 22, 2024, issued in counterpart CN Application No. 202111239110.X, with English translation. (15 pages).

Office Action dated Mar. 12, 2025, issued in U.S. Appl. No. 18/522,754 (10 pages).

Extended European Search Report dated Feb. 19, 2025, issued in European patent application No. 22937855.9 (7 pages).

Extended European Search Report dated Mar. 12, 2025, issued in European patent application No. 22955997.6 (8 pages).

Office Action dated May 16, 2025, issued in U.S. Appl. No. 17/927,576. (16 pages).

Office Action dated Jun. 18, 2025, issued in counterpart Chinese patent application No. 202210389051.2 with English translation (14 pages).

Office Action dated Jul. 2, 2025, issued in U.S. Appl. No. 17/927,792. (19 pages).

\* cited by examiner

CIRCUIT BOARD AND METHOD FOR MANUFACTURING THE SAME, FUNCTIONAL BACKPLATE, BACKLIGHT MODULE AND DISPLAY APPARATUS

CROSS-REFERENCE TO RELATED APPLICATION

This application is a Section 371 National Stage Application of International Application No. PCT/CN2022/077542, filed Feb. 24, 2022, entitled "CIRCUIT BOARD AND METHOD FOR MANUFACTURING THE SAME, FUNCTIONAL BACKPLATE, BACKLIGHT MODULE AND DISPLAY APPARATUS", which is incorporated herein by reference in its entirety.

TECHNICAL FIELD

The present disclosure relates to a field of a display technology, and in particular, to a circuit board and a method for manufacturing the circuit board, a functional backplate, a backlight module, a display apparatus, and a display panel.

BACKGROUND

In a process of manufacturing a circuit board, since a pad position of the PCB is required to be welded with an electronic element and the conductive material of copper at the pad position reacts with the solder very rapidly, the intermetallic compound (IMC) has a large thickness at the pad position, resulting in a very low yield of re-welding. A new alloy layer may be introduced to solve the large thickness problem of the intermetallic compound at the pad position, but a problem of forming an undercut structure and a tip structure may be raised due to an uneven etching rate during the etching of the conductive layer, and this may cause a failure of an effective coverage of the conductive layer by other stacked structures laid on the conductive layer.

It should be noted that the information disclosed in the above-mentioned background section is only used to improve an understanding of the background of the present disclosure, and thus information that does not constitute the prior art known to those skilled in the art may be included.

SUMMARY

In an aspect, a circuit board is provided, including: a base substrate; a wire arranged on the base substrate, where the wire includes a first conductive layer; and at least one insulating layer arranged on a side of the first conductive layer away from the base substrate. where the at least one insulating layer covers the first conductive layer. The first conductive layer includes a first stacked structure on a side away from the base substrate and a second stacked structure proximate to the base substrate, and the first stacked structure includes at least an etch stop layer covering the second stacked structure.

In some exemplary embodiments of the present disclosure, the first stacked structure includes the etch stop layer, a first metal layer and a first oxidation barrier layer that are sequentially arranged away from the base substrate. An orthographic projection of the etch stop layer on the base substrate, an orthographic projection of the first metal layer on the base substrate, and an orthographic projection of the first oxidation barrier layer on the base substrate overlap with one another.

In some exemplary embodiments of the present disclosure, the first oxidation barrier layer covers the first metal layer, and the first metal layer covers the etch stop layer.

In some exemplary embodiments of the present disclosure, the second stacked structure includes a bonding layer, a second metal layer and a second oxidation barrier layer that are sequentially arranged away from the base substrate. An orthographic projection of the second oxidation barrier layer on the base substrate and an orthographic projection of the second metal layer on the base substrate are within an orthographic projection of the bonding layer on the base substrate.

In some exemplary embodiments of the present disclosure, an included angle between a side surface of the first stacked structure in a length direction of the first stacked structure and a plane in which the base substrate is located is in a range of 60° to 90°.

In some exemplary embodiments of the present disclosure, an included angle between a side surface of the second stacked structure in a length direction of the second stacked structure and a plane in which the base substrate is located is in a range of 60° to 80°.

In some exemplary embodiments of the present disclosure, the etch stop layer has a thickness greater than 3000 Å, the first metal layer has a thickness in a range of 3000 Å to 20000 Å, and the first oxidation barrier layer has a thickness less than 1000 Å.

In some exemplary embodiments of the present disclosure, the etch stop layer includes a NiV alloy or a NiW alloy, the first metal layer includes copper, and the first oxidation barrier layer includes a CuNi alloy.

In some exemplary embodiments of the present disclosure, the bonding layer has a thickness in a range of 200 Å to 1000 Å, the second metal layer has a thickness in a range of 3000 Å to 60000 Å, and the second oxidation barrier layer has a thickness in a range of 200 Å to 500 Å.

In some exemplary embodiments of the present disclosure, the bonding layer includes Mo or a MoNb alloy, the second metal layer includes copper, and the second oxidation barrier layer includes a NiV alloy or a NiW alloy.

In some exemplary embodiments of the present disclosure, a mass ratio content of V element in the NiV alloy is in a range of 3% to 15%, and a mass ratio content of W element in the NiW alloy is in a range of 10% to 50%.

In some exemplary embodiments of the present disclosure, a mass ratio content of Ni element in the CuNi alloy is in a range of 10% to 30%.

In some exemplary embodiments of the present disclosure, the wire further includes: a second conductive layer arranged between the base substrate and the first conductive layer, where the first conductive layer and the second conductive layer are separated by the at least one insulating layer.

In some exemplary embodiments of the present disclosure, the circuit board further includes an alignment mark arranged between the base substrate and the first conductive layer.

In some exemplary embodiments of the present disclosure, the circuit board further includes a via hole penetrating through the at least one insulating layer, where the via hole exposes part of a surface of the first conductive layer away from the base substrate.

In another aspect, a method for manufacturing a circuit board is provided, including: forming a base substrate; forming a wire on the base substrate, where the forming a wire includes forming a first conductive layer; and forming at least one insulating layer, where the at least one insulating layer is arranged on a side of the first conductive layer away from the base substrate and covers the first conductive layer. The first conductive layer includes a first stacked structure on a side away from the base substrate and a second stacked structure proximate to the base substrate, and the first stacked structure includes at least an etch stop layer covering the second stacked structure.

In some exemplary embodiments of the present disclosure, the forming a first conductive layer includes: forming a second stacked structure film layer including the second stacked structure on a side proximate to the base substrate by deposition, and etching the second stacked structure film layer to form the second stacked structure; and forming a first stacked structure film layer including the first stacked structure on a side of the second stacked structure away from the base substrate, and etching the first stacked structure film layer to form the first stacked structure.

In yet another aspect, a functional backplate is provided, including: the circuit board as described above; an intermetallic compound layer and a conductive connection layer stacked on the circuit board in a direction perpendicular to and away from the base substrate of the circuit board; and an electronic element electrically connected to the conductive connection layer.

In yet another aspect, a backlight module is provided, including the functional backplate as described above.

In yet another aspect, a display apparatus is provided, including a display panel, and the backlight module as described above, where the display panel is arranged on a light output side of the backlight module.

In yet another aspect, a display panel is provided, including the function backplate as described above.

In yet another aspect, a display apparatus is provided, including the display panel as described above.

BRIEF DESCRIPTION OF THE DRAWINGS

In order to clearly describe the technical schemes of the present disclosure, accompanying drawings required in some embodiments of the present disclosure will be briefly introduced below. Obviously, the accompanying drawings in the following descriptions are only accompanying drawings of some embodiments of the present disclosure. For those skilled in the art, other accompanying drawings may also be obtained from these accompanying drawings. In addition, the accompanying drawings in the following descriptions may be regarded as schematic diagrams, and are not intended to limit an actual size of a product, an actual flow of a method, an actual timing of a signal, etc. involved in the embodiments of the present disclosure.

Figure 1:
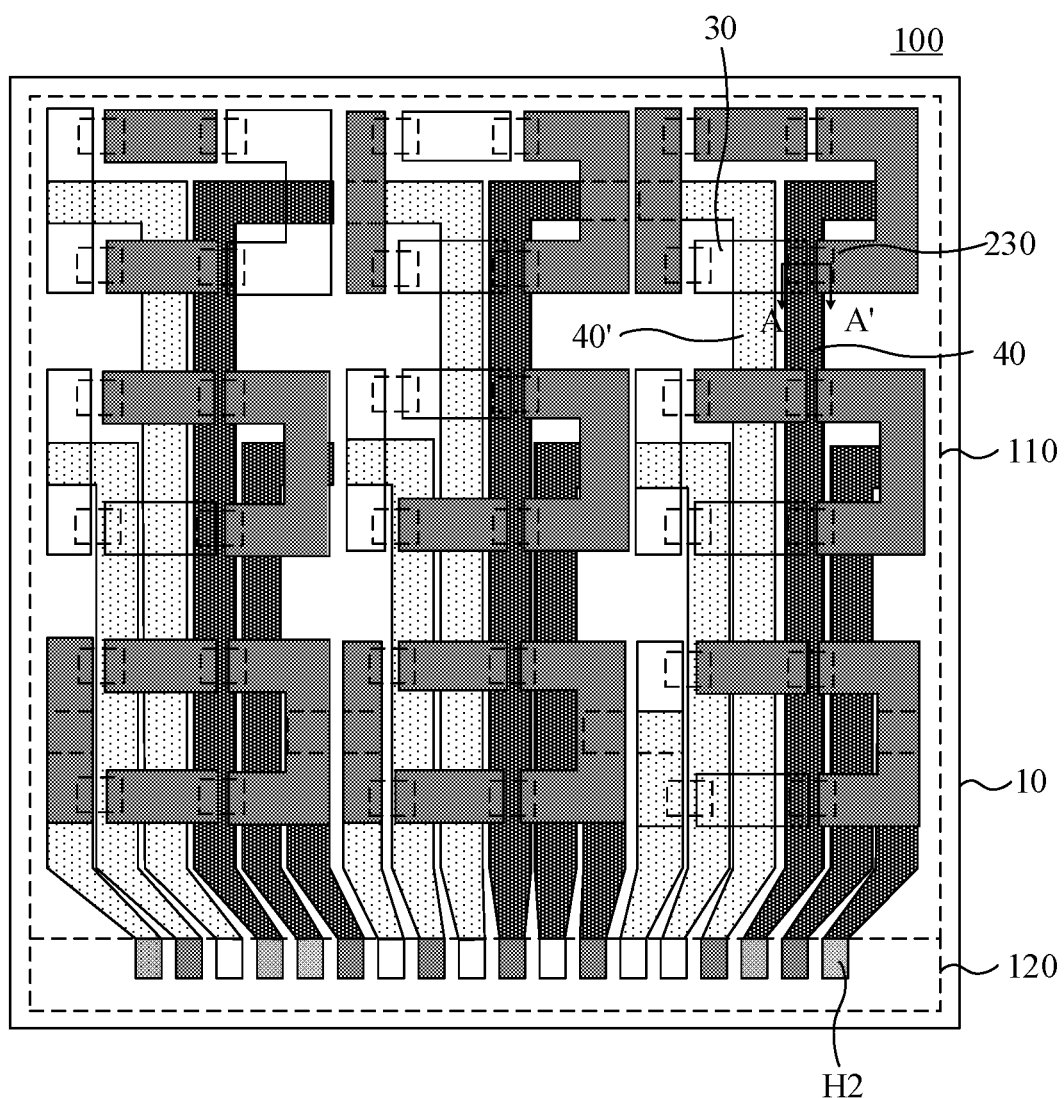
FIG. 1 shows a schematic plan view of a circuit board according to an embodiment of the present disclosure.

It should be noted that, for the sake of clarity, in the accompanying drawings used to describe the embodiments of the present disclosure, a size of a layer, a structure, or a region may be enlarged or reduced, that is, the accompanying drawings may not be drawn to actual scales.

DETAILED DESCRIPTION OF EMBODIMENTS

The technical schemes in some embodiments of the present disclosure will be clearly and completely described below in combination with the accompanying drawings. Obviously, the described embodiments are only part, but not all of the embodiments of the present disclosure. Based on the embodiments provided by the present disclosure, all other embodiments obtained by those skilled in the art fall within the scope of protection of the present disclosure.

Unless the context required otherwise, in the entire specification and claims, the term "comprise" and other forms thereof, such as the third-person singular form "comprises" and a present participle form "comprising" are construed as open and inclusive, that is, "inclusive, but not limited to". In the description of the specification, terms "one embodiment", "some embodiments", "exemplary embodiments", "example", "specific example", or "some examples" are intended to indicate that specific features, structures, materials, or characteristics related to the embodiment(s) or example(s) are included in at least one embodiment or example of the present disclosure. Schematic representations of the above-mentioned terms are not necessarily refer to the same embodiment(s) or example(s). In addition, the specific features, structures, materials, or characteristics may be included in any one or more embodiments or examples in any suitable manner.

Terms "first" and "second" are only used for descriptive purposes and are not to be construed as indicating or implying the relative importance or implicitly indicating the number of indicated technical features. Thus, a feature defined by "first" and "second" may explicitly or implicitly include one or more of the features. In the description of the embodiments of the present disclosure, unless otherwise specified, term "plurality" means two or more.

In the description of some embodiments, the expression "connection" and a derivative thereof may be used. For example, when some embodiments are described, a term "electrical connection" may be used to indicate that two or more components are in direct physical or electrical contact with each other.

"At least one of A, B, and C" has the same meaning as "at least one of A, B, or C", and both include the following combinations of A, B, and C: only A, only B, only C, a combination of A and B, a combination of A and C, a combination of B and C, and a combination of A, B, and C.

"A and/or B" includes the following three combinations: only A, only B, and a combination of A and B.

"Configured to" as used herein means an open and inclusive language, which does not exclude an apparatus that is applicable or configured to perform an additional task or step.

In addition, the use of "based on" means an open and inclusive language, since a process, a step, a calculation, or other actions "based on" one or more of conditions or values may be based on additional conditions or exceed the values in practice.

As used herein, "about" or "approximately" includes the stated value and an average value within an acceptable deviation range for the particular value. The acceptable deviation range is determined by those skilled in the art considering the measurement being discussed and the error related to measurement of the particular quantity (i.e., the limitation of the measurement system).

As used herein, "parallel", "vertical", and "equal" include the stated situation and a situation similar to the stated situation. A range of the similar situation falls within an acceptable deviation range. The acceptable deviation range is determined by those skilled in the art considering the measurement being discussed and the error (i.e., the limitation of the measurement system) related to the measurement of the particular quantity. For example, the term "parallel" includes "absolutely parallel" and "approximately parallel", where an acceptable deviation range of "approximately parallel" may be within 5°. The term "vertical" includes "absolutely vertical" and "approximately vertical", where an acceptable deviation range of "approximately vertical" may also be within 5°. The term "equal" includes "absolutely equal" and "approximately equal". For example, an acceptable deviation range of "approximate equal" may be that a difference between the two that are equal is less than or equal to 5% of either.

It should be understood that when a layer or element is referred as being on another layer or substrate, the layer or element may be directly on another layer or substrate, or an intermediate layer exists between the layer or element and the other layer or substrate.

The term "same layer" used herein refers to a layer structure former by forming a film layer for formation of a specific pattern through a same film forming process, and then performing a patterning process on the film layer using a mask. According to different specific patterns, a patterning process may include a plurality of exposure, development or etching processes. The specific patterns in the formed layer structure may be continuous or discontinuous, and they may also be located at different heights or have different thicknesses. On the contrary, the term "different layers" refers to a layer structure formed by forming film layers for formation of specific patterns through corresponding film forming processes, respectively, and then performing patterning processes on the film layers using corresponding masks. For example, the expression "two layer structures are arranged in different layers" indicates that two layer structures are respectively formed in corresponding process steps (a film forming process and a patterning process).

Exemplary embodiments are described herein with reference to sectional views and/or plan views that are idealized exemplary drawings. In the drawings, thicknesses of layers and regions are enlarged for clarity. As such, variations from the shapes of the accompanying drawings as a result, for example, of manufacturing techniques and/or tolerances, are to be expected. Therefore, exemplary embodiments should not be construed as limited to a shape of a region as shown herein, but are to include a shape deviation due to, for example, manufacturing. For example, an etched region shown as a rectangle may generally have a curved feature. Therefore, the regions shown in the drawings are schematic in nature and their shapes are not intended to show the actual shapes of the regions of the device and are not intended to limit the scope of the exemplary embodiments.

In a related technology, in order to electrically connect an electronic element to a circuit board, generally, a surface mounted technology (SMT) is used, where the electronic element having a pin is placed on an exposed surface of a conductive pattern of the circuit board, and then the electronic element and the circuit board are welded together to be assembled by using a reflow soldering or dip soldering method. In an actual welding process, copper, which reacts rapidly with a solder, is generally used as a conductive material of the circuit board, and an intermetallic compound (IMC) is generated at an interface of a pad surface to form an electrical connection. However, when a poor connection between the electronic element and the pad occurs, and it is necessary to remove the electronic element and perform re-welding, the re-welding of the above-mentioned structure may have a very low yield.

In order to solve the above-mentioned problem, an embodiment of the present disclosure provide a circuit board. The circuit board includes, but is not limited to: a base substrate; a wire arranged on the base substrate, where the wire includes a first conductive layer; and at least one insulating layer arranged on a side of the first conductive layer away from the base substrate, where the at least one insulating layer covers the first conductive layer. The first conductive layer includes a first stacked structure on a side away from the base substrate and a second stacked structure proximate to the base substrate, and the first stacked structure includes at least an etch stop layer, where the etch stop layer covers the second stacked structure. According to the embodiments of the present disclosure, by providing the etch stop layer, an undercut structure or a tip structure of the second stacked structure may be effectively prevented during an etching process, so that other stacked structures laid on the conductive layer may effectively cover the conductive layer. In this way, a yield of re-welding of the circuit board at the first conductive layer may be improved, and a production yield of the circuit board may be improved.

A structure of the circuit board according to the embodiments of the present disclosure will be described in detail below with reference to FIG. 1 to FIG. 5.

FIG. 1 shows a schematic plan view of a circuit board according to an embodiment of the present disclosure. As shown in FIG. 1, a circuit board 100 includes an element region 110 and a bonding region 120. For example, the bonding region 120 is on a side of the element region 110. The circuit board 100 includes a first conductive layer 30 and a second conductive layer 40 (40') arranged in the element region 110, where an exposed region of a surface of the first conductive layer 30 is configured to be connected to a pin of an electronic element 230. The circuit board 100 further includes a plurality of conductive terminals H2 arranged in the bonding region 120, where the conductive terminals H2 are to be connected to the circuit board and may be arranged in the same layer with the second conductive layer 40. In the present disclosure, the electronic element may include at least one of an inorganic light-emitting diode with a size less than 500 microns, a sensor chip, an integrated circuit chip, or the like. The inorganic light-emitting diode and/or the sensor chip may be driven by the integrated circuit chip, or the inorganic light-emitting diode and/or the sensor chip may be driven by a combination of a plurality of thin film transistors which are interconnected and matched with each other and are arranged on the circuit board.

Figure 2:
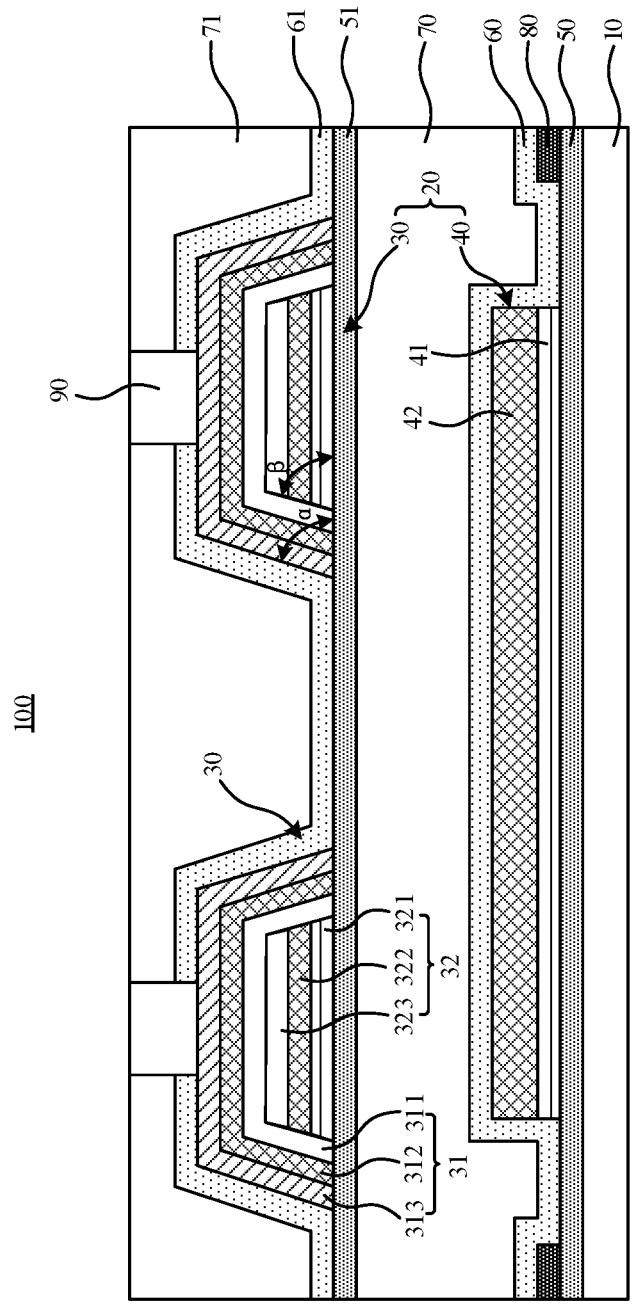
FIG. 2 shows a schematic structural diagram of a section of a circuit board taken along line AA' in FIG. 1 according to an embodiment of the present disclosure.

FIG. 2 shows a schematic structural diagram of a section of a circuit board taken along line AA' in FIG. 1 according to an embodiment of the present disclosure. As shown in FIG. 2, the circuit board 100 includes a base substrate 10, and a wire 20 arranged on the base substrate, where the wire 20 includes a first conductive layer 30 and a second conductive layer 40. At least one insulating layer is arranged on a side of the first conductive layer 30 away from the base substrate 10, and the at least one insulating layer covers the first conductive layer 30.

In an embodiment of the present disclosure, the first conductive layer 30 includes a first stacked structure 31 arranged on a side away from the base substrate 10 and a second stacked structure 32 arranged on a side proximate to the base substrate 10. The first stacked structure 31 and the second stacked structure 32 are covered by the at least one insulating layer.

As shown in FIG. 2, each stacked structure has a plurality of sub layers, where at least one sub layer of the first stacked structure 31 is an etch stop layer 311, which covers the second stacked structure 32. By configuring the etch stop layer to cover the second stacked structure 32, it is possible to ensure that the etch stop layer 311 blocks the etching of the second stacked structure 32 by an etching medium during the etching of the first stacked structure 31, so that it may be effectively avoided that different etching rates of the etching medium for the second stacked structure cause defects such as an undercut structure of the second stacked structure 32 with respect to the first stacked structure 31 and a tip structure of the first stacked structure 31 with respect to the second stacked structure 32.

In an embodiment of the present disclosure, the first stacked structure 31 includes the etch stop layer 311, a first metal layer 312, and a first oxidation barrier layer 313 that are sequentially arranged away from the base substrate 10.

As described above, the etch stop layer 311 is used for blocking the etching of the second stacked structure 32 by the etching medium. The first metal layer 312 is used for transmitting of an electrical signal in a circuit. The first oxidation barrier layer 313 is arranged on a side of the first metal layer 312 away from the base substrate 10 and is used for blocking oxidation of the first metal layer 312. That is, during the welding with the electronic element, the material of the first metal layer 312 for transmitting the electric signal may be easily oxidized, however, the first metal layer 312 may be protected by providing the first oxidation barrier layer 313.

An orthographic projection of the etch stop layer 311, an orthographic projection of the first metal layer 312, and an orthographic projection of the first oxidation barrier layer 313 on the base substrate 10 overlap with one another. For example, in such embodiments, the orthographic projection of the etch stop layer 311 on the base substrate 10 is within the orthographic projection of the first metal layer 312 on the base substrate 10, and the orthographic projection of the first metal layer 312 on the base substrate 10 is within the orthographic projection of the first oxidation barrier layer 313 on the base substrate 10. That is, during the formation of the first stacked structure, areas of the orthographic projections of the first oxidation barrier layer 313, the etch stop layer 311, and the first metal layer 312 on the base substrate 10 gradually increase. In other optional embodiments, the orthographic projections of the etch stop layer 311, the first metal layer 312, and the first oxidation barrier layer 313 on the base substrate 10 may be completely coincident with each other.

In embodiments of the present disclosure, the first oxidation barrier layer 313 covers the first metal layer 312, and the first metal layer 312 covers the etch stop layer 311.

The first oxidation barrier layer 313 covers the first metal layer 312, so that the first metal layer 312 may be protected. The first metal layer 312 covers the etch stop layer 311, so that defects such as the undercut structure of the second stacked structure 32 with respect to the first stacked structure 31 and the tip structure of the first stacked structure 31 with respect to the second stacked structure 32, which are caused by a small etching rate of an etching solution for the etch stop layer and a large etching rate of the etching solution for the first metal layer 312 and the first oxidation barrier layer 313, may be further reduced during the etching of the first stacked structure. By such configuration, the generation of the defect may be effectively reduced and the product yield may be improved.

In an embodiment of the present disclosure, as shown in FIG. 2, the second stacked structure 32 includes a bonding layer 321, a second metal layer 322 and a second oxidation barrier layer 323 that are sequentially arranged away from the base substrate 10.

The second stacked structure 32 is configured to be a structure having a plurality of sub layers, so that a welding performance between the first conductive layer 30 and the electronic element may be ensured when the first conductive layer 30 is welded, and problems such as a poor contact due to a plurality of times of welding may be prevented. In such embodiments, at least one insulating layer is arranged between the base substrate 10 and the first conductive layer 30. For example, at least one insulating layer includes a buffer layer for improving a stress between the base substrate 10 and other stacked structures, and then a plurality of insulating layers are formed, such as a first insulating layer 60 and a second insulating layer 51. The bonding layer 321 is formed on the second insulating layer 51, then the second metal layer 322 is formed on the bonding layer 321, and then the second oxidation barrier layer 323 is formed on the second metal layer 322.

In the embodiments, the formed bonding layer 321 may allow the second metal layer 322 to have a good adhesion, so that the formed second metal layer 322 may be adhered firmly. The second oxidation barrier layer 323 is formed on the second metal layer 322, so as to prevent oxidation of the second metal layer 322 during a welding process, thereby providing a better protection for the second metal layer 322.

In an embodiment of the present disclosure, orthographic projections of the second oxidation barrier layer 323 and the second metal layer 322 on the base substrate 10 are within an orthographic projection of the bonding layer 321 on the base substrate 10.

For example, the second oxidation barrier layer 323 is within the orthographic projection of the bonding layer 321 on the base substrate 10, and the orthographic projection of the second metal layer 322 on the base substrate 10 is within the orthographic projection of the bonding layer 321 on the base substrate 10. That is, an area of the orthographic projections of the second oxidation barrier layer 323 on the base substrate and an area of the second metal layer 322 on the base substrate are smaller than an area of the orthographic projection of the bonding layer on the base substrate 10. Widths of both side edges of the second oxidation barrier layer 323 and widths of both side edges of the second metal layer 322 are smaller than widths of both side edges of the bonding layer 321, so that difficulty in a formation process of the second stacked structure may be reduced, and the product yield may be effectively improved.

In an embodiment of the present disclosure, as shown in FIG. 2, an included angle α between a side surface of the first stacked structure 31 in a length direction of the first stacked structure 31 and a plane in which the base substrate 10 is located is in a range of 60° to 90°, for example, the included angle α may be set to 60°, 70°, 80°, or 90°. An included angle β between a side surface of the second stacked structure 32 in a length direction of the second stacked structure 32 and the plane in which the base substrate 10 is located is in a range of 60° to 80°, for example, the included angle β may be set to 60°, 70°, or 80°.

In such embodiments, for example, the length direction of the first stacked structure 31 and the length direction of the second stacked structure 32 may be a direction perpendicular to the paper surface, and side edges in the length direction may refer to two side edges parallel to a direction of the base substrate 10 in FIG. 2.

By setting the included angle α within the range of 60° to 90° and the included angle β within the range of 60° to 80°, it may be ensured that the difficulty in the formation process of the first stacked structure 31 and the second stacked structure 32 is reduced and the product yield is improved.

In an embodiment of the present disclosure, a material of the etch stop layer 311 of the first stacked structure 31 includes a nickel base alloy. The nickel base alloy refers to an alloy made by doping other metals into a nickel base metal. For example, the nickel base alloy includes a nickel vanadium alloy (NiV), a nickel tungsten alloy (NiW), etc. A material of the first metal layer 312 includes copper (Cu). In the case where copper is used as the material of the first metal layer, copper may be easily oxidized during a welding process. The first oxidation barrier layer 313 is arranged on the side of the first metal layer 312 away from the base substrate 10, which may effectively avoid an oxidation problem of the first metal layer 312 during the welding process, resulting in improving the repairability for the circuit board 100 and the number of repairs allowed on the circuit board 100 (i.e., a maintainability rate), reducing a scrap rate of the circuit board 100, and improving a cumulative yield. The first oxidation barrier layer 313 includes a copper nickel alloy (CuNi).

In embodiments of the present disclosure, a material of the bonding layer 321 of the second stacked structure 32 includes a molybdenum nickel titanium alloy (MoNiTi), a molybdenum (Mo) or a molybdenum niobium alloy (MoNb), etc. The second metal layer 322 includes a conductive material such as copper (Cu), etc. The second oxidation barrier layer 323 includes a nickel vanadium alloy (NiV), a nickel tungsten alloy (NiW), etc. The second oxidation barrier layer 323 is arranged on a side of the second metal layer 322 away from the base substrate 10, which may effectively avoid an oxidation problem of the second metal layer 322 during the welding process, resulting in further improving the repairability for the circuit board 100.

In embodiments of the present disclosure, the respective sub layers of the second stacked structure 32 have different thicknesses and materials, and the etching medium have different etching rates for the sub layers. Therefore, in a process of etching the second stacked structure by using a lithography process, the etching rates for the different sub layers are inconsistent, causing the problem of the undercut structure and the tip structure.

Figure 3:
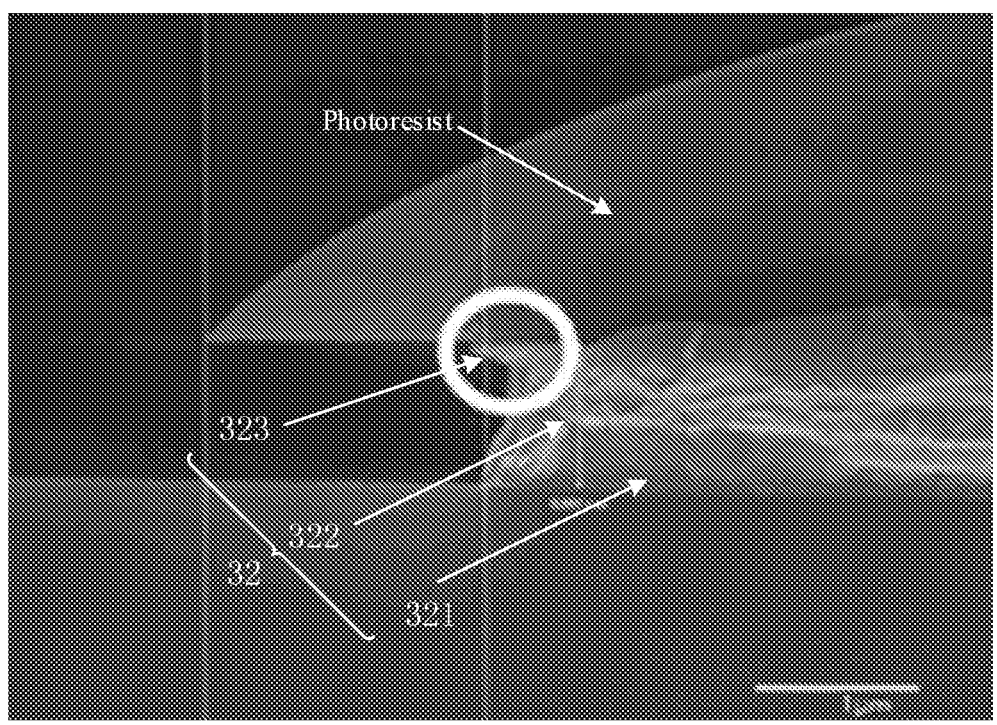
FIG. 3 shows a photomicrograph of a defect of a second stacked structure of a circuit board in a case where a second oxidation barrier layer has a large thickness according to an embodiment of the present disclosure.

FIG. 3 shows a photomicrograph of a defect of a second stacked structure of a circuit board in a case where a second oxidation barrier layer has a large thickness according to an embodiment of the present disclosure.

As shown in FIG. 3, the inventors of the present disclosure found a rule between the film thickness and the morphology of the etched film in experiments by the configuration of different thicknesses of the sub layers of the second stacked structure 32. When the second oxidation barrier layer 323 has a thickness greater than 1000 Å and an $H_2O_2$ system is used as an etching solution, the etching solution has different etching rates for different materials, for example, an etching rate of the etching solution for the second oxidation barrier layer 323 is less than an etching rate of the etching solution for the second metal layer. When the second oxidation barrier 323 has a thickness greater than 1000 Å, the second oxidation barrier 323 has a protruding tip structure with respect to film layers on a side proximate to the base substrate 10, and a length of the tip structure is greater than 0.2 um. If other film layers are further formed on the second stacked structure 32, the upper layer structure may fail to effectively cover the lower structure. In other words, the film layers formed on the second stacked structure 32 may fail to cover a region below the tip structure region of the second oxidation barrier layer 323, which may reduce the product yield.

In further experiments, the inventors of the present disclosure found by configuring the thickness of the second barrier layer 323 in a certain range, the tip structure problem of the second barrier layer 323 with respect to the film layer on the side proximate to the base substrate may be avoided. The inventors of the present disclosure found that when the thickness of the second oxidation barrier layer 323 is in a range of 200 Å to 500 Å, the second metal layer 322 may be protected, and the tip structure problem may be avoided in the formation of the second stacked structure by etching.

Figure 4:
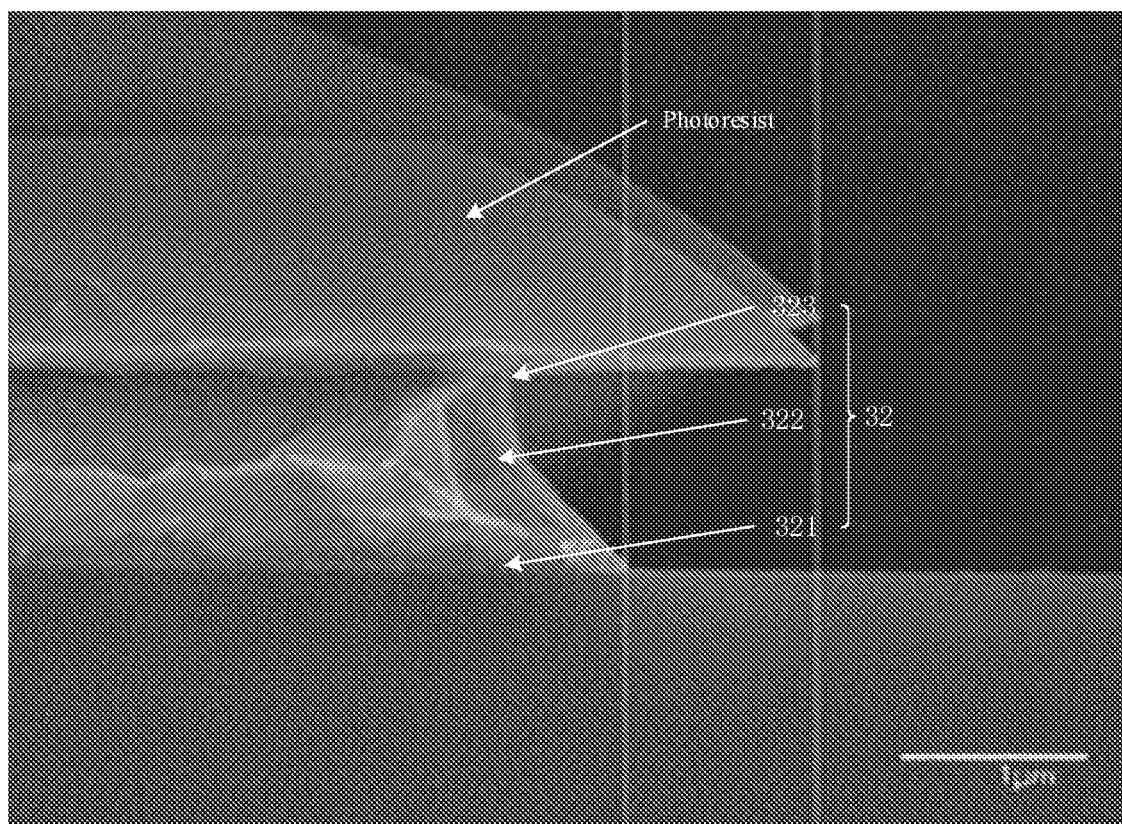
FIG. 4 shows a photomicrograph of a defect of a second stacked structure of a circuit board in a case where a second oxidation barrier layer has a small thickness according to an embodiment of the present disclosure.

FIG. 4 shows a photomicrograph of a defect of a second stacked structure of a circuit board in a case where a second oxidation barrier layer has a small thickness according to an embodiment of the present disclosure.

As shown in FIG. 4, when the thickness of the second etch stop layer 323 is less than 500 Å, the second stack structure 32 is photoetched using a lithography process, and the $H_2O_2$ system is used as the etching solution. After the etching, it may be seen that a length of the tip structure of the second barrier layer 323 with respect to the film layer on the side proximate to the base substrate 10 is less than 0.05 um, which may be almost ignored. In addition, the film layers formed on the second stacked structure 32 may effectively cover a film layer on the side proximate to the base substrate below the second stacked structure 32.

Figure 5:
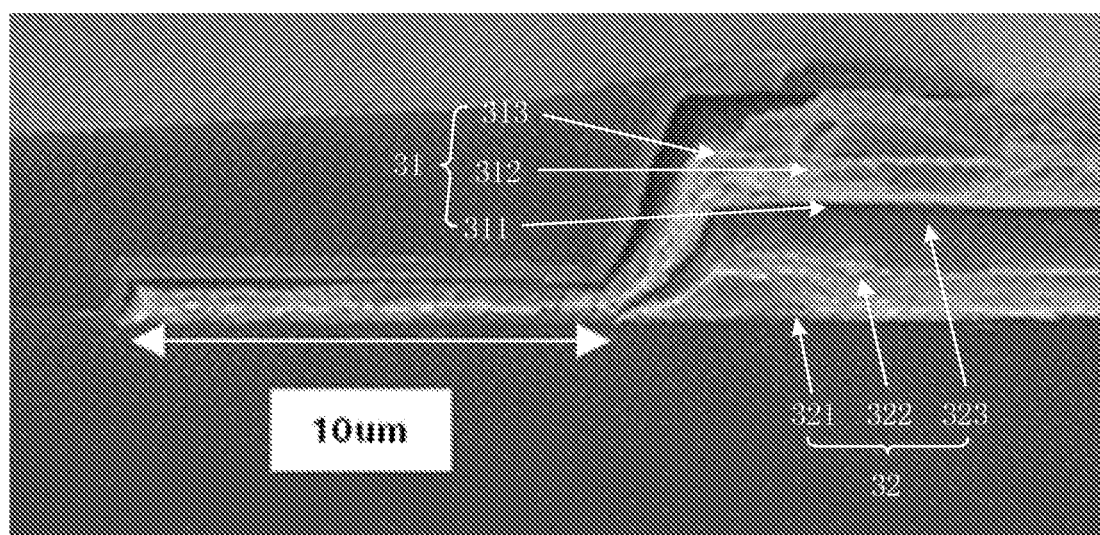
FIG. 5 shows a photomicrograph of a circuit board when a first stacked structure is formed on a second stacked structure according to an embodiment of the present disclosure.

FIG. 5 shows a photomicrograph of a circuit board when a first stacked structure is formed on a second stacked structure according to an embodiment of the present disclosure.

After the second stacked structure 32 is formed, the first stacked structure 31 is further formed on a side of the second stacked structure 32 away from the base substrate 10.

After the second stacked structure 32 is formed, in the formation of the first stacked structure 31 on the side of the second stacked structure 32 away from the base substrate 10, an etching solution including 20% high $HNO_3$, acetic acid, and an additive is used in the lithography process. An etching rate of the etching solution for the first oxidation barrier layer of the first stacked structure is less than an etching rate of the etching solution for the first metal layer. The scheme of the first oxidation barrier layer 313 covering the first metal layer 312 and the first metal layer 312 covering the etch stop layer 311 may be a good solution to the problem caused by the etching rate difference of the etching solution. In an actual experiment, as shown in FIG. 5, no tip structure is formed in the second stacked structure 32. In addition, the first stacked structure 31 may effectively cover the second stacked structure 32, and a film layer formed on a side of the first stacked structure 31 away from the base substrate 10 may also effectively cover the first stacked structure 31. Therefore, the circuit board in the present disclosure may not only have good repairability and number of repairs allowed on the circuit board 100 (i.e., a maintainability rate), but also have a good production yield in the manufacturing process.

In an embodiment of the present disclosure, the etch stop layer 311 has a thickness greater than 3000 Å, the first metal layer 312 has a thickness in a range of 3000 Å to 20000 Å, and the first oxidation barrier layer 313 has a thickness less than 1000 Å.

For example, the etch stop layer 311 has a thickness of 4000 Å, 5000 Å, 8000 Å, or the like. The first metal layer 312 has a thickness of 3000 Å, 10000 Å, 20000 Å, or the like. The first oxidation barrier layer 313 has a thickness of 200 Å, 500 Å, 800 Å, or the like.

In an embodiment of the present disclosure, the bonding layer 321 has a thickness in a range of 200 Å to 1000 Å, the second metal layer 322 has a thickness in a range of 3000 Å to 60000 Å, and the second oxidation barrier layer 323 has a thickness in a range of 200 Å to 500 Å.

For example, the bonding layer 321 has the thickness of 200 Å, 500 Å, or 1000 Å. The second metal layer 322 has a thickness of 3000 Å, 5000 Å, 10000 Å, 30000 Å, 60000 Å, or the like. The second oxidation barrier layer 323 has a thickness of 200 Å, 300 Å, 400 Å, 500 Å, or the like.

In an embodiment of the present disclosure, the etch stop layer 311 of the first stacked structure 31 and the second oxidation barrier layer 323 of the second stacked structure 32 may be made of the same material, for example, both are made of a NiV alloy or a NiW alloy. A mass ratio content of the V element in the NiV alloy is in a range of 3% to 15%, and a mass ratio content of the W element in the NiW alloy is in a range of 10% to 50%.

For example, the mass ratio content of the V element in the NiV alloy is 3%, 10%, 15%, or the like. The mass ratio content of the W element in the NiW alloy is 10%, 20%, 40%, 50%, or the like.

In an embodiment of the present disclosure, the first oxidation barrier layer 313 is made of a CuNi alloy material, and a mass ratio content of the Ni element in the CuNi alloy is in a range of 10% to 30%.

For example, the mass ratio content of the Ni element in the CuNi alloy is 10%, 20%, 30%, or the like.

In an embodiment of the present disclosure, as shown in FIG. 2, the wire 20 of the circuit board 100 further includes the second conductive layer 40. The second conductive layer 40 is arranged between the base substrate 10 and the first conductive layer 30, and the first conductive layer 30 and the second conductive layer 40 are separated by at least one insulating layer.

The second conductive layer 40 includes an adhesive layer 41 on a side proximate to the base substrate 10 and a metal layer 42 on a side away from the base substrate 10. For example, the adhesive layer 41 may be made of a material the same as the material of the bonding layer 321 described above. For example, the metal layer 42 may be made of copper.

In an embodiment of the present disclosure, the circuit board 100 further includes an alignment mark 80 arranged between the base substrate 10 and the first conductive layer 30. The alignment mark is located on the periphery of the second conductive layer 40 and is used for alignment.

In an embodiment of the present disclosure, the circuit board 100 further includes a via hole 90 penetrating through the at least one insulating layer. The via hole 90 exposes part of a surface of the first conductive layer 30 on a side away from the base substrate.

The following is a detailed description of the respective stacked structures of the circuit board 100 according to the embodiments of the present disclosure in combination with FIG. 2.

As shown in FIG. 2, the circuit board 100 includes the base substrate 10, a buffer layer 50 is arranged on the base substrate 10, and at least one alignment mark 80 is arranged on a side of the buffer layer 50 away from the base substrate 10. The circuit board 100 further includes the second conductive layer 40. The first insulating layer 60 covering the second conductive layer 40 and the at least one alignment mark 80 is arranged on a side of the second conductive layer 40 away from the base substrate 10, where the first insulating layer 60 may be made of, for example a SiN or SiO material. A first planarization layer 70 covering the insulating layer 60 is arranged on a side of the first insulating layer 60 away from the base substrate 10. A second insulating layer 51 covering the first planarization layer 70 is arranged on a side of the first planarization layer 70 away from the base substrate 10. For example, the second insulating layer 51 may be made of a SiN or SiO material, and is used to block an outgas of the first planarization layer 70 during the manufacturing process. In addition, the second insulating layer 51 may enhance the adhesion of the first conductive layer 30. The first conductive layer 30 having a plurality of stacked structures is arranged on a side of the second insulating layer 51 away from the base substrate 10. A third insulating layer 61 covering the first conductive layer 30 is arranged on the side of the first conductive layer 30 away from the base substrate 10, and a second planarization layer 71 covering the third insulating layer 61 is formed on a side of the third insulating layer 61 away from the base substrate 10. The circuit board 100 further includes via holes 90 penetrating through the second planarization layer 71 and the third insulating layer 61. The electronic element is electrically connected to the first conductive layer 30 through the via hole 90.

Some embodiments of the present disclosure further provide a method for manufacturing a circuit board. The method for manufacturing the circuit board according to the embodiments of the present disclosure will be described in detail below in combination with FIG. 6 to FIG. 7.

Figure 6:
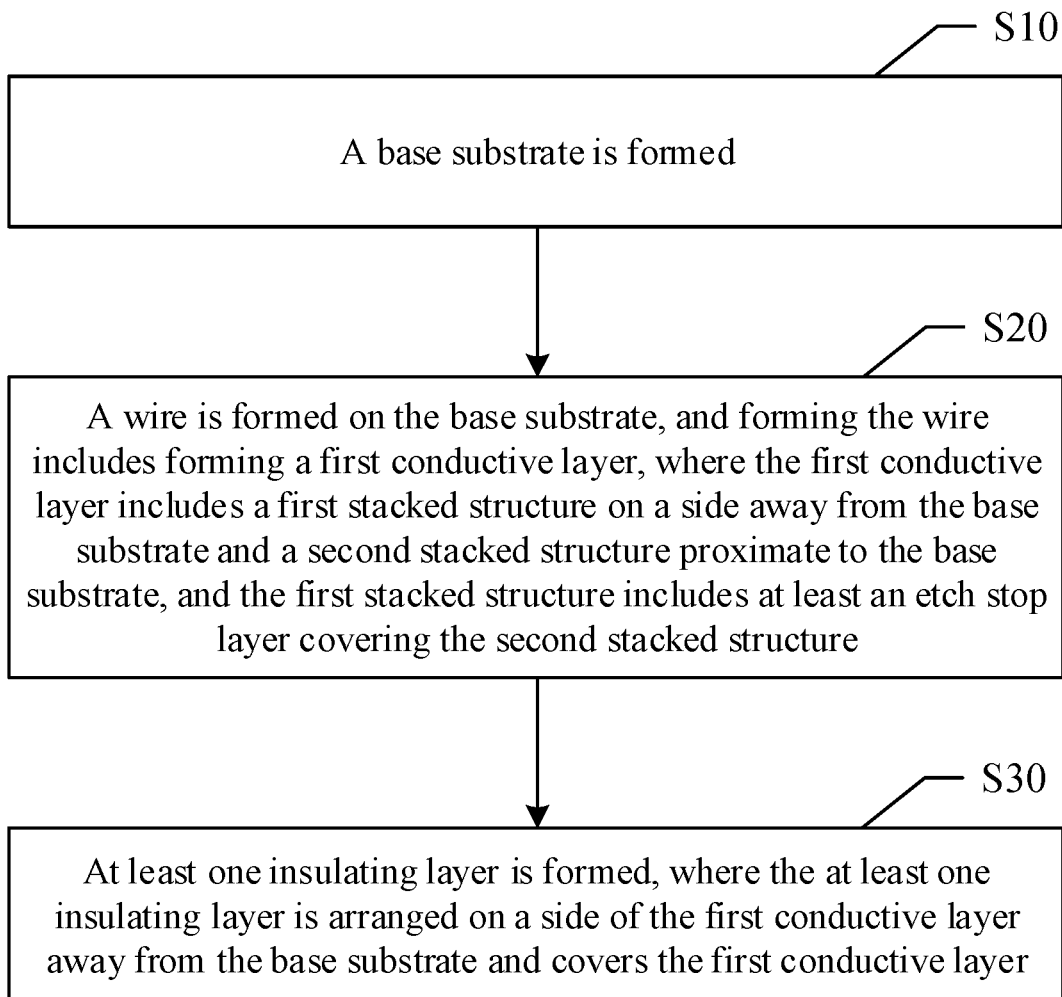
FIG. 6 shows a flowchart of a method for manufacturing a circuit board according to an embodiment of the present disclosure.
Figure 7:
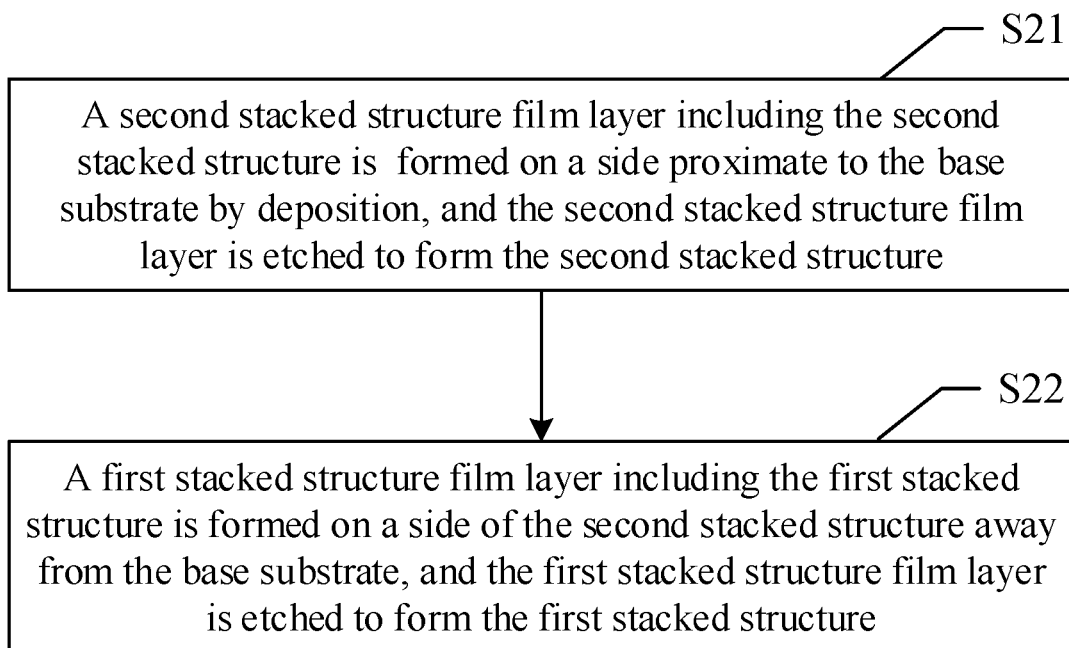
FIG. 7 shows a flowchart of forming a first conductive layer in a method for manufacturing a circuit board according to an embodiment of the present disclosure.

FIG. 6 shows a flowchart of a method for manufacturing a circuit board according to an embodiment of the present disclosure. FIG. 7 shows a flowchart of forming a first conductive layer in a method for manufacturing a circuit board according to an embodiment of the present disclosure.

As shown in FIG. 6, the method for manufacturing the circuit board includes steps S10 to S30.

In step S10, a base substrate is formed.

In step S20, a wire is formed on the base substrate, where forming the wire includes forming a first conductive layer. The first conductive layer includes a first stacked structure on a side away from the base substrate and a second stacked structure proximate to the base substrate. The first stacked structure includes at least an etch stop layer, where the etch stop layer covers the second stacked structure.

For example, it can be seen in combination with FIG. 2 that a first conductive layer 30 may be provided on the base substrate 10 in a deposition manner. Before the first conductive layer 30 is formed, at least one insulating layer is formed on the base substrate 10. For example, a buffer layer 50 is formed by deposition, and a first insulating layer 60, a first planarization layer 70, and a second insulating layer 51 are formed. Also, a second conductive layer 40 is formed between the first insulating layer 60 and the base substrate 10.

In step S30, at least one insulating layer is formed, where the at least one insulating layer is arranged on a side of the first conductive layer away from the base substrate, and the at least one insulating layer covers the first conductive layer.

The at least one insulating layer is formed on the side of the first conductive layer 30 away from the base substrate 10, for example, a third insulating layer 61 covering the first conductive layer 30 and a second planarization layer 71 covering the third insulating layer 61 are formed.

For example, the third insulating layer 61 and the second planarization layer 71 may be formed by deposition.

As shown in FIG. 7, forming the first conductive layer includes steps S21 to S22.

In step S21, a second stacked structure film layer including a second stacked structure is formed on a side proximate to the base substrate by deposited, and the second stacked structure film layer is etched to form the second stacked structure.

In an embodiment of the present disclosure, the second stacked structure film layer including the second stacked structure is formed on an insulating layer (e.g., the second insulating layer 51) on a side proximate to the base substrate by deposited. A photoresist is provided on the second stacked structure film layer, and the second stacked structure film layer is etched to form the second stacked structure. In such embodiment, for example, an etching solution of an $H_2O_2$ system may be selected. The second oxidation barrier layer 323 of the second stack structure 32 has a thickness in a range of 200 Å to 500 Å. Defects such as a tip structure may be effectively avoided during the etching, so that the product yield may be improved.

In step S22, a first stacked structure film layer including the first stacked structure is formed on a side of the second stacked structure away from the base substrate, and the first stacked structure film layer is etched to form the first stacked structure.

In an embodiment of the present disclosure, after the second stacked structure is formed, the first stacked structure film layer including the first stacked structure is further formed on the side of the second stacked structure away from the base substrate by deposited. A photoresist is provided on the first stacked structure film layer, and the first stacked structure film layer is etched to form the first stacked structure. In such embodiment, for example, an etching solution including a 20% high $HNO_3$ content, an acetic acid, and an additive may be selected. The etch stop layer of the first stacked structure has a thickness greater than 3000 Å, so that not only etching of the second stacked structure by the etching solution may be effectively blocked, but also a second metal layer in the second stacked structure may be protected.

In the embodiments of the present disclosure, the method further includes forming other stacked structures as shown in FIG. 2, in addition to the above-mentioned steps.

Figure 8:
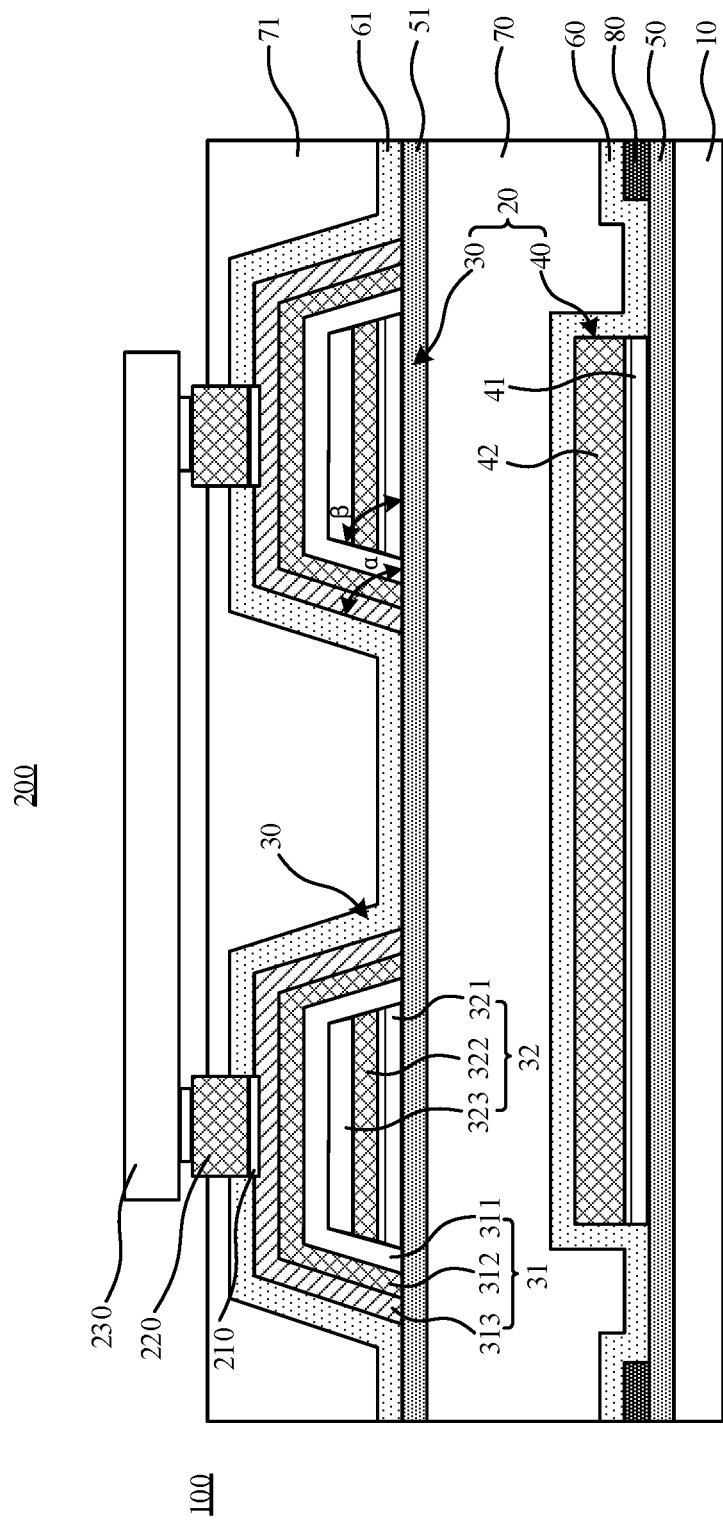
FIG. 8 shows a structural diagram of a functional backplate according to an embodiment of the present disclosure.

FIG. 8 shows a structural diagram of a functional backplate according to an embodiment of the present disclosure.

Optionally, in some embodiments of the present disclosure, a functional backplate is further provided. As shown in FIG. 8, the functional backplate 200 includes the above-mentioned circuit board 100, and an intermetallic compound layer 210 and a conductive connection layer 220 that are stacked on the circuit board in a direction perpendicular to and away from a base substrate of the circuit board. An electronic element 230 is electrically connected to the first conductive layer 30 through the conductive connection layer 220 and the intermetallic compound layer 210. In the embodiments of the present disclosure, the intermetallic compound layer 210 may be formed through, for example, the interdiffusion of a metal in the first oxidation barrier layer 313 and a metal in the conductive connection layer 220 at a high temperature, or the reaction between the metal in the first oxidation barrier layer 313 and the metal in the conductive connection layer 220 at a high temperature, and a part of the intermetallic compound layer 210 is in a surface of the first oxidation barrier layer 313.

It may be understood that the electronic element may be a light-emitting device, such as a micro inorganic light-emitting diode chip, and the functional backplate 200 includes a plurality of light-emitting devices.

Figure 9:
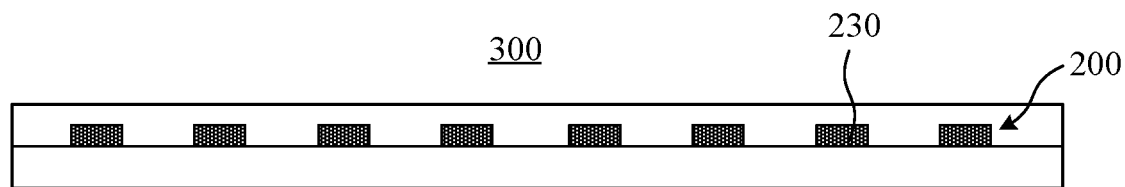
FIG. 9 shows a structural diagram of a backlight module according to an embodiment of the present disclosure.

FIG. 9 shows a structural diagram of a backlight module according to an embodiment of the present disclosure.

As shown in FIG. 9, some embodiments of the present disclosure further provide a backlight module 300, which includes a functional backplate 200 according to any one of the above-mentioned embodiments.

It may be understood that the functional backplate 200 includes a plurality of electronic elements 230 (i.e., light-emitting devices), and the light-emitting devices may be micro inorganic light-emitting diode chips. That is, the backlight module 300 is a light-emitting plate including a plurality of micro inorganic light-emitting diodes arranged in an array.

the backlight module 300 in the above-mentioned embodiments of the present disclosure has a beneficial effect the same as the beneficial effect of the functional backplate 200 and the circuit board 100, which will not be repeated here.

Figure 10:
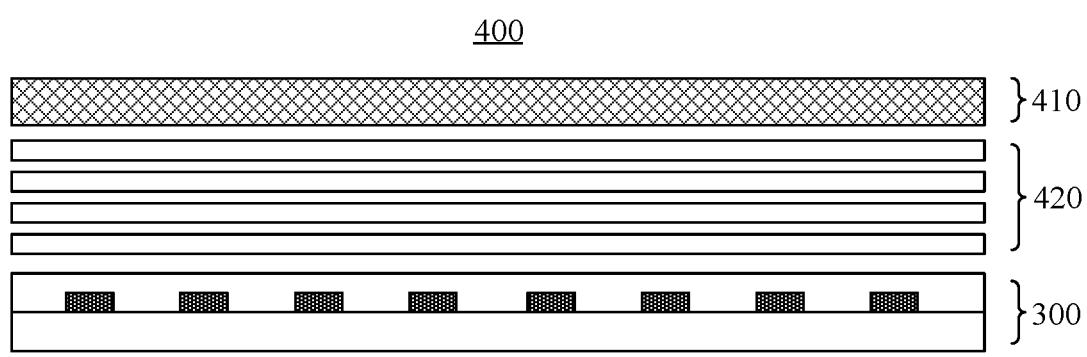
FIG. 10 shows a schematic diagram of a display apparatus according to an embodiment of the present disclosure.

FIG. 10 shows a schematic diagram of a display apparatus according to an embodiment of the present disclosure.

As shown in FIG. 10, some embodiments of the present disclosure provide a display apparatus 400. The display apparatus 400 includes a display panel 410 and the above-mentioned backlight module 300, and the display panel 410 is arranged on a light output side of the backlight module 300.

For example, the display panel 410 may be a liquid crystal display (LCD).

For example, as shown in FIG. 10, the display apparatus 400 further includes a plurality of optical films 420, which are between the backlight module 300 and the display panel 410 and used for adjusting light emitted from the backlight module 300.

Some embodiments of the present disclosure provide a display panel including the functional backplate as described in the above embodiments.

It may be understood that the functional backplate 200 includes a plurality of light-emitting devices, which may be inorganic light-emitting diode chips with a size less than 500 microns, for example, the size may be in a range between 100 microns and 300 microns, or may be less than 100 microns. For example, the light-emitting devices may include red-light inorganic light-emitting diode chips, greenlight inorganic light-emitting diode chips, or blue-light inorganic light-emitting diode chips.

Figure 11:
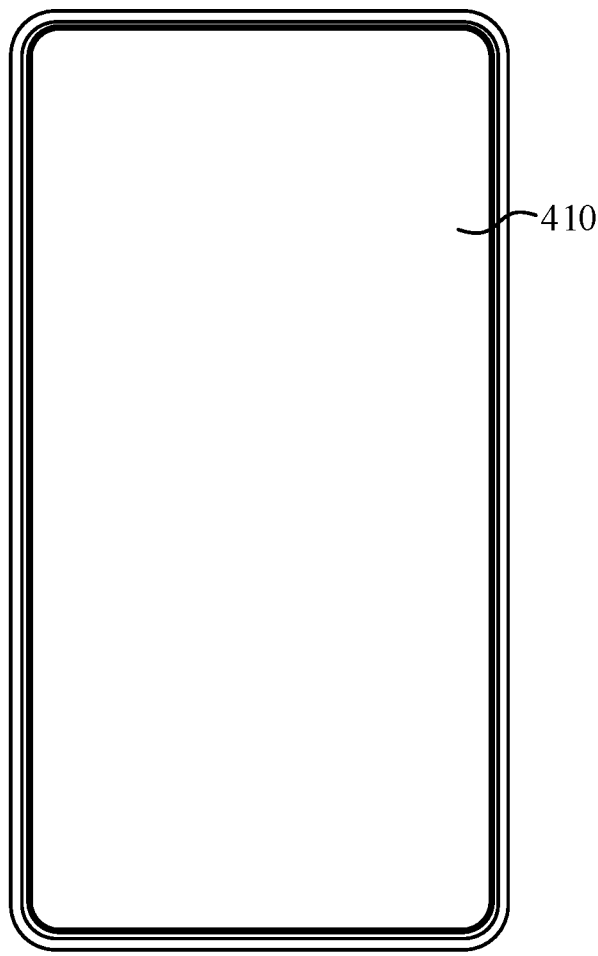
FIG. 11 shows a schematic diagram of another display apparatus according to an embodiment of the present disclosure.

FIG. 11 shows a schematic diagram of another display apparatus according to an embodiment of the present disclosure.

As shown in FIG. 11, some embodiments of the present disclosure further provide a display apparatus 500. The display apparatus 500 includes the display panel 410 according to the above embodiments.

The display apparatus 500 in the above-mentioned embodiments of the present disclosure has a beneficial effect the same as the beneficial effect of the display panel 410, which will not be repeated here.

The above-mentioned display apparatus 500 may be any apparatus that displays either a moving (e.g., a video) or fixed (e.g., a still image) text or image. More specifically, it is expected that the embodiments may be implemented in or associated with a plurality of electronic devices. For example, the plurality of electronic devices include (but not limited to) a mobile phone, a wireless device, a personal data assistant (PDA), a handheld or portable computer, a GPS receiver/navigator, a camera, an MP4 video player, a video camera, a game console, a watch, a clock, a calculator, a television monitor, a tablet display, a computer monitor, a car display (e.g. an odometer display, etc.), a navigator, a cockpit controller and/or display, a display for a camera view (e.g., a display of a rear-view camera in a vehicle), an electronic photo, an electronic billboard or sign, a projector, a building structure, a packaging, an aesthetic structure (e.g., a display for an image of a piece of jewelry), etc.

Although some embodiments of the general concept of the present disclosure have been illustrated and described, those of ordinary skill in the art will understand that these embodiments may be changed without departing from the principles and spirit of the general concept of the present disclosure, and the scope of protection of the present disclosure is defined by claims and their equivalents.

What is claimed is:
1. A circuit board, comprising:
a base substrate;
a wire arranged on the base substrate, wherein the wire comprises a first conductive layer; and
at least one insulating layer arranged on a side of the first conductive layer away from the base substrate, wherein the at least one insulating layer covers the first conductive layer, wherein
the first conductive layer comprises a first stacked structure on a side away from the base substrate and a second stacked structure proximate to the base substrate; and
the first stacked structure comprises at least an etch stop layer covering the second stacked structure; and
wherein the first stacked structure comprises the etch stop layer, a first metal layer and a first oxidation barrier layer that are sequentially arranged away from the base substrate; and
wherein an orthographic projection of the etch stop layer on the base substrate, an orthographic projection of the first metal layer on the base substrate, and an orthographic projection of the first oxidation barrier layer on the base substrate overlap with one another.

2. The circuit board according to claim 1, wherein the first oxidation barrier layer covers the first metal layer, and the first metal layer covers the etch stop layer.

3. The circuit board according to claim 1, wherein
the second stacked structure comprises a bonding layer, a second metal layer and a second oxidation barrier layer that are sequentially arranged away from the base substrate; and
an orthographic projection of the second oxidation barrier layer on the base substrate and an orthographic projection of the second metal layer on the base substrate are within an orthographic projection of the bonding layer on the base substrate.

4. The circuit board according to claim 3, wherein
the bonding layer has a thickness in a range of 200 Å to 1000 Å, the second metal layer has a thickness in a range of 3000 Å to 60000 Å, and the second oxidation barrier layer has a thickness in a range of 200 Å to 500 Å.

5. The circuit board according to claim 3, wherein the bonding layer comprises Mo or a MoNb alloy, the second metal layer comprises copper, and the second oxidation barrier layer comprises a NiV alloy or a NiW alloy.

6. The circuit board according to claim 1, wherein
an included angle between a side surface of the first stacked structure in a length direction of the first stacked structure and a plane in which the base substrate is located is in a range of 60° to 90°.

7. The circuit board according to claim 1, wherein
an included angle between a side surface of the second stacked structure in a length direction of the second stacked structure and a plane in which the base substrate is located is in a range of 60° to 80°.

8. The circuit board according to claim 1, wherein
the etch stop layer has a thickness greater than 3000 Å, the first metal layer has a thickness in a range of 3000 Å to 20000 Å, and the first oxidation barrier layer has a thickness less than 1000 Å.

9. The circuit board according to claim 1, wherein
the etch stop layer comprises a NiV alloy or a NiW alloy, the first metal layer comprises copper, and the first oxidation barrier layer comprises a CuNi alloy.

10. The circuit board according to claim 9, wherein a mass ratio content of V element in the NiV alloy is in a range of 3% to 15%, and a mass ratio content of W element in the NiW alloy is in a range of 10% to 50%.

11. The circuit board according to claim 9, wherein a mass ratio content of Ni element in the CuNi alloy is in a range of 10% to 30%.

12. The circuit board according to claim 1, wherein the wire further comprises:
a second conductive layer arranged between the base substrate and the first conductive layer, wherein the first conductive layer and the second conductive layer are separated by the at least one insulating layer.

13. The circuit board according to claim 1, further comprising:
a via hole penetrating through the at least one insulating layer, wherein the via hole exposes part of a surface of the first conductive layer away from the base substrate.

14. A functional backplate, comprising:
the circuit board according to claim 1;
an intermetallic compound layer and a conductive connection layer stacked on the circuit board in a direction perpendicular to and away from the base substrate of the circuit board; and
an electronic element electrically connected to the conductive connection layer.

15. A backlight module, comprising the functional backplate according to claim 14.

16. A display apparatus, comprising:
a display panel; and
the backlight module according to claim 15,
wherein the display panel is arranged on a light output side of the backlight module.

17. A display apparatus comprising a display panel, wherein the display panel comprises the functional backplate according to claim 14.

18. A method for manufacturing a circuit board, comprising:
forming a base substrate;
forming a wire on the base substrate, wherein the forming a wire comprises forming a first conductive layer; and
forming at least one insulating layer, wherein the at least one insulating layer is arranged on a side of the first conductive layer away from the base substrate and covers the first conductive layer,
wherein the first conductive layer comprises a first stacked structure on a side away from the base substrate and a second stacked structure proximate to the base substrate, and
the first stacked structure comprises at least an etch stop layer covering the second stacked structure; and
wherein the first stacked structure comprises the etch stop layer, a first metal layer and a first oxidation barrier layer that are sequentially arranged away from the base substrate; and
wherein an orthographic projection of the etch stop layer on the base substrate, an orthographic projection of the first metal layer on the base substrate, and an orthographic projection of the first oxidation barrier layer on the base substrate overlap with one another.

19. The method according to claim 18, wherein
the forming a first conductive layer comprises:
forming a second stacked structure film layer including the second stacked structure on a side proximate to the base substrate by deposition, and etching the second stacked structure film layer to form the second stacked structure; and
forming a first stacked structure film layer including the first stacked structure on a side of the second stacked structure away from the base substrate, and etching the first stacked structure film layer to form the first stacked structure.

\* \* \* \* \*